(12) United States Patent
Alcoe et al.

(10) Patent No.: US 7,629,684 B2
(45) Date of Patent: Dec. 8, 2009

(54) ADJUSTABLE THICKNESS THERMAL INTERPOSER AND ELECTRONIC PACKAGE UTILIZING SAME

(75) Inventors: David J. Alcoe, Hayward, WI (US); Varaprasad V. Calmidi, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 61 days.

(21) Appl. No.: 11/396,711

(22) Filed: Apr. 4, 2006

(65) Prior Publication Data
US 2007/0230130 A1 Oct. 4, 2007

(51) Int. Cl.
*H01L 23/34* (2006.01)

(52) U.S. Cl. .............. 257/720; 257/E23.106; 257/706; 257/707; 257/712; 438/122; 361/704

(58) Field of Classification Search .......... 257/778, 257/E23.09, E23.106, E23.107, 704–707, 257/712, 720; 361/704, 679.54, 705, 710, 361/719; 438/122, 473, 476
See application file for complete search history.

(56) References Cited

U.S. PATENT DOCUMENTS

| | | | |
|---|---|---|---|
| 5,387,815 A | 2/1995 | Nishiguchi | |
| 5,396,403 A * | 3/1995 | Patel | 361/705 |
| 5,585,671 A | 12/1996 | Nagesh et al. | |
| 5,621,615 A | 4/1997 | Dawson et al. | |
| 5,710,459 A | 1/1998 | Teng et al. | |
| 5,757,620 A | 5/1998 | Edwards et al. | |
| 5,821,161 A | 10/1998 | Covell, II et al. | |
| 5,825,087 A | 10/1998 | Iruvanti et al. | |
| 5,881,945 A | 3/1999 | Edwards et al. | |
| 5,990,418 A | 11/1999 | Bivona et al. | |
| 6,091,603 A | 7/2000 | Daves et al. | |
| 6,218,730 B1 | 4/2001 | Toy et al. | |
| 6,292,369 B1 | 9/2001 | Daves et al. | |
| 6,294,408 B1 | 9/2001 | Edwards et al. | |
| 7,026,711 B2 * | 4/2006 | Lee et al. | 257/706 |
| 2004/0164401 A1 * | 8/2004 | Alcoe et al. | 257/704 |
| 2005/0068737 A1 * | 3/2005 | Leija et al. | 361/704 |

* cited by examiner

*Primary Examiner*—Chris C Chu
(74) *Attorney, Agent, or Firm*—Hinman, Howard & Kattell; Lawrence R. Fraley; Mark Levy

(57) ABSTRACT

An electronic package which includes a substrate (e.g., a chip carrier substrate or a PCB), an electronic component (e.g., a semiconductor chip), a heatsink and a thermal interposer for effectively transferring heat from the chip to the heatsink. The interposer includes a compressible, resilient member (e.g., an elastomeric pad) and a plurality of thin, metallic sheets (e.g., copper foils) and the thickness thereof can be adjusted by altering the number of such foils.

19 Claims, 2 Drawing Sheets

ADJUSTABLE THICKNESS THERMAL INTERPOSER AND ELECTRONIC PACKAGE UTILIZING SAME

TECHNICAL FIELD

The present invention relates to structures and methods for controlling the thickness of the gap between a semiconductor chip and a lid, heatsink (also referred to herein as a heat sink), or other cooling mechanism designed to provide cooling for the chip. More particularly, the present invention is directed to an assembly (interposer) in which the size of the gap (thickness) between the chip and the cooling mechanism is controlled, preferably so that the gap is as small as possible without deleteriously affecting the assembly process, chip integrity, or assembly performance.

BACKGROUND OF THE INVENTION

Electronic packages (sometimes called modules) including semiconductor chips, especially high power chips, demand that heat from the chip be effectively dissipated away from the chip to the environment external of the package. The ability of the package to dissipate heat generated by the chip(s) is generally a function of the quality of the primary heat dissipation path from the chip to the external surface of the module. As is well known, inefficient heat escape can deleteriously affect the chip's operation and life.

In some known package designs, thermal paste or some other thermally conductive material is used as a type of interposer at a point in the primary heat dissipation path from the chip(s) to the package's external surface. Such paste is normally compliant in nature, thus presenting advantageous features. Some of these advantages include the ability to accommodate statistical variations in thickness of the chip(s) to be housed in the package, height of the chip's solder connections (in the case of the more advantageous "flip chip" packaging), cavity depth of the cooling structure, thickness of the seal (between the cooling structure, if bonded onto the package substrate), substrate camber, etc. The ability to control variations in the dimensions of such components is difficult, especially where the components come from different sources (vendors) or where reworking or modification of such components is required. This problem is especially apparent where large scale commercial production is involved. A compliant interposer helps considerably in this regard.

With respect to such heat dissipation paths, including those which utilize compliant pastes or the like, it is also known that the interposer or like component which forms the path from the chip(s) to the underside of the cooling structure may form the "weakest link" in the heat dissipation path; that is, interposers which use pastes or other materials may possess a lower thermal conductivity than other components of the heat dissipation path. It is essential, therefore, that any interfacing structure between chip and the cooling structure possess effective thermal conductivity, to thereby assure optimal heat escape for the sensitive chip.

Various examples of interposer structures are described in the following patents.

In U.S. Pat. No. 5,387,815, there is described a semiconductor chip module which includes a substrate on which a wiring portion is formed, a semiconductor chip mounted so as to face a circuit side down to the wiring portion, a heat sink with one end in contact with a side opposite to the circuit side of the semiconductor chip, and a cap enclosing the semiconductor chip and having an opening exposing externally the other end of the heat sink. A metal film is formed at least on the inner wall of the opening and on the surface of the heatsink which is inserted into the cap. An adhesive material is filled between the tip portion of the heat sink and the semiconductor chip, while an adhesive material is filled between the metal films.

In U.S. Pat. No. 5,396,403, there is described a heat sink assembly for a multi-chip module. A thermally conductive plate is bonded to the chips using indium solder. The plate in turn is thermally coupled to a heat sink (cooling) structure (e.g., comprised of finned aluminum) by thermal paste. The plate is made of a material such as silicon carbide or copper-tungsten alloy having a relatively low coefficient of expansion to minimize mechanical stress resulting from lateral motion of the chips due to thermal expansion. Relatively low-power chips may be thermally coupled to the plate by thermal paste instead of being bonded by solder.

In U.S. Pat. No. 5,585,671, there is described a "flip chip" package with a thermally-conductive lid attached to a backside of the chip by a die attach layer of a predetermined thickness range. A rim is formed on the lid with a depth less than a sum of a thickness of the chip, the interconnects, and a minimum final thickness of the die attach layer by a predetermined margin. An initial thickness of thermally-filled epoxy is applied to the backside of the chip and a layer of lid attach epoxy is applied to the rim of the lid in a thickness sufficient to span the predetermined margin. The lid is floated on the die attach layer with the rim of the lid surrounding the chip and floating on the lid attach material. The lid is clamped against the chip with a force sufficient to compress the die attach material to a predetermined thickness in a range less than the initial thickness and not less than the minimum final thickness. An oxide layer, such as an iron or iron-alloy oxide layer, is formed on the bottom surface of the rim. A spacer is placed on the backside of the chip within the die attach material, to define the minimum final thickness of the die attach layer. A beveled or stepped vent hole is formed in the lid and plugged and sealed.

In U.S. Pat. No. 5,621,615, there is described a "flip chip" package comprised of a substrate, a ring structure attached to the substrate, a heat removal structure, and a chip thermally coupled to the heat removal structure. The package lid is comprised of a ring structure and a heat removal structure. The ring structure and heat removal structure are separated until after attachment of the ring structure to the substrate allowing the ring structure to be brazed to the substrate. Brazing the ring structure to the substrate decreases the mechanical stress to the chip. A die attach material between the first major surface of the die and the first major surface of the heat removal structure adheres the die to and thermally couples the die to the heat removal structure. The die attach layer is of a predetermined thickness and thus provides a determined low thermal resistance making the thermal performance of the package certain.

In U.S. Pat. No. 5,710,459, there is described an electronic package which includes a chip cap for covering and protecting an integrated chip therein. The chip cap further forms a concave step near a lower edge of the cap for wrapping around the edge of the package's adapter board for increasing the contact areas between the cap and the board and for attaching the cap to the board. The chip cap is composed of thermal conductive materials and the chip cap further includes a heat sink for dissipating heat generated from the chip. The adapter board further includes a plurality of connecting vias and a plurality of conductive metal balls forming a ball grid array (BGA) underneath the adapter board. The chip is in electrical and thermal contact with the BGA by filling the connection vias with conductive materials. A printed circuit board (PCB)

is used for supporting and receiving the adapter board thereon. The PCB includes a plurality of thermal vias penetrating there-through and filled with thermal conductive materials, wherein the thermal vias corresponding to and in contact with a plurality of the conductive metal balls of the BGA are used for dissipating heat generated from the chip.

In U.S. Pat. No. 5,757,620, there is described an apparatus and a method that provides customized cooling of a MCM (Multi-Chip Module) by varying the depth of a thermal compound-filled gap or blind hole above each chip in the module.

In U.S. Pat. No. 5,821,161, there is described a structure and a method that uses a multi-layer metallic seal to provide protection to chips on a chip carrier. This multi-layer metal seal is a two layer, solder structure which is used to create a low cost, high reliability, hermetic seal for the module. This solder structure has a thick high melting point temperature region that is attached to a cap, and a thin interconnecting region of lower melting point temperature region for sealing the substrate to the cap.

In U.S. Pat. No. 5,825,087, there is described an electronic module with integrated circuit chips mounted on a substrate and having a specially designed cooling plate overlying the chips and producing a gap above same in which a thermal paste or thermal adhesive is positioned. The cooling plate has a roughened area made by grit blasting and the like which penetrates the thermal paste and thermal adhesive and improves the adhesion and inhibits the flow of thermal paste from between the lower surface of the cooling plate and the upper surface of the chip during operation of the electronic module.

In U.S. Pat. No. 5,881,945, there is described a structure and method that uses a multi-layer metallic seal to provide protection to chips on a chip carrier. This multi-layer metal seal provides both enhanced hermeticity lifetime and environmental protection. In one embodiment, the multi-layer metallic seal band is a three layer, solder sandwich structure which is used to create a low cost, high reliability, hermetic seal for the module. This solder sandwich has a high melting temperature thick solder inner core, and lower melting point thin interconnecting solder layers, where the thin interconnecting solder layers may have similar or different melting points.

In U.S. Pat. No. 5,990,418, there is described a device and method for hermetically sealing an integrated circuit (semiconductor) chip between a substrate and a lid while providing dissipation of heat generated by the integrated circuit chip. The device includes an integrated circuit chip, carrier substrate, interface coolant, and a lid. The chip is attached to the top of the carrier substrate. The interface coolant is disposed on the top of the integrated circuit chip and the lid is placed on top of the carrier substrate/integrated circuit chip combination and contacts the interface coolant. The interface coolant provides a thermal path for conducting heat from the integrated circuit chip to the lid.

In U.S. Pat. No. 6,091,603, there is described an integrated circuit chip packaging module characterized by a customized lid understructure which enables a reduction in the amount of compliant thermally conductive material in the primary heat dissipation path. The lid structure and module are made by processes wherein the lid understructure is customized for the chip(s) to be housed. The customization is achieved by the use of shims and a deformable lid understructure.

In U.S. Pat. No. 6,218,730, tolerances in chip, substrate and hardware dimensions are accommodated by means of a floating sealing structure to insure that compliant thermally conductive paste disposed between the chip and its lid is as trim as possible in order to reduce thermal resistance of the paste so as to be able to run the chip at a cooler temperature. Standoffs are also preferably employed to insure proper paste gap thickness.

In U.S. Pat. No. 6,292,369, there is described an integrated circuit chip package including a customized lid understructure which enables a reduction in the amount of compliant thermally conductive material in the primary heat dissipation path. The lid structure and package are made by processes wherein the lid understructure is customized for the chip(s) to be housed. The customization is achieved by the use of shims and a deformable lid understructure.

In U.S. Pat. No. 6,294,408, there is described an electronic chip assembly which maintains a thin gap spacing between the chip and the lid or heat sink to allow the electronic chip to operate at a relatively cool temperature. Thermal performance is allegedly enhanced by a thermal interface material provided in the thin gap and maintained at a minimal thickness as a result of the structure and assembly process. A thin thermal interface material layer may be achieved with a compression step to compress the thermal interface material before the sealant is cured. In addition, a vent hole is provided in the assembly to prevent pressure build-up inside the package during sealant cure. As the sealant is cured, the gap spacing is maintained, further compression of the thermal interface material is not required, and seal defects are allegedly prevented.

The present invention defines an interposer structure capable of providing effective heat transference there-across while enabling adjustment of the structure's thickness in a relatively facile manner. The structure defined herein is able to provide these advantages while utilizing components which are relatively inexpensive to manufacture and assemble. It is believed that such a structure would represent a significant advancement in the art.

OBJECTS AND SUMMARY OF THE INVENTION

It is, therefore, an object of the invention to enhance the art of thermal interposers, and particularly interposers designed for implementation within electronic packages.

It is another object of the invention to provide an electronic package with a thermal interposer which provides an excellent heat path for heat generated from an electronic component to the package's heat sink.

It is yet another object of the invention to provide such an electronic package which can be produced in a relatively inexpensive manner.

It is still another object of the invention to control force application and assure acceptable tolerance ranges during the assembly of electronic packages and the like while assuring a highly efficient path of heat dissipation for such packages.

According to one embodiment of the invention, there is provided an electronic package comprising a circuitized substrate, an electronic component positioned on the circuitized substrate, a heat sink thermally coupled to the electronic component for providing escape of heat from the component during operation of the component, and a thermal interposer positioned between the component and heat sink for providing a thermal path for heat generated by the component to the heat sink, the thermal interposer including at least one compressible resilient member and a plurality of thin, metallic members.

BEST MODE FOR CARRYING OUT THE INVENTION

Figure 1:
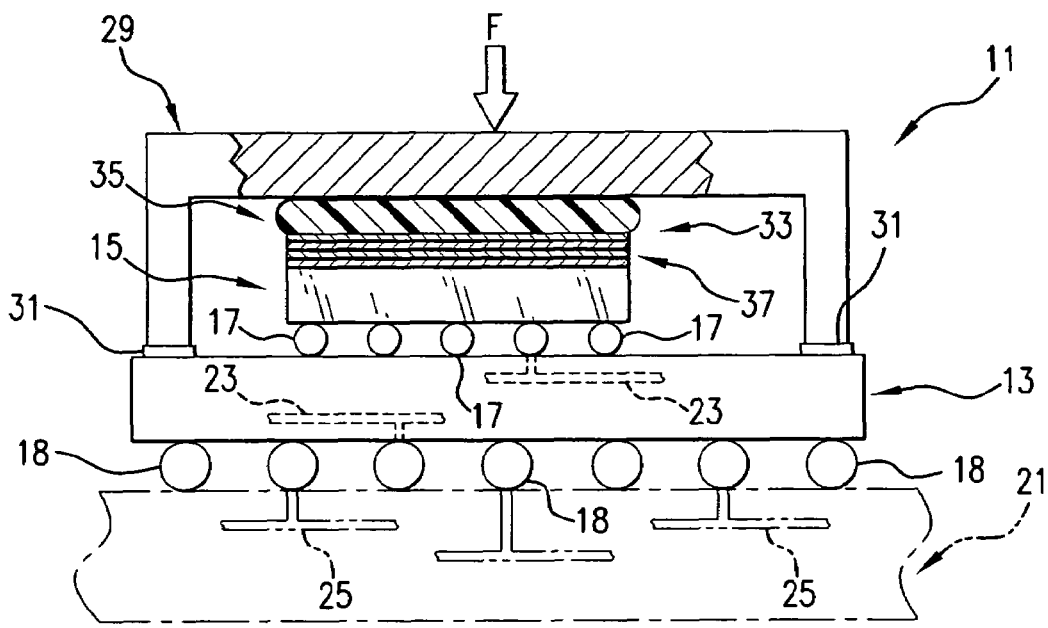
FIG. 1 is an enlarged side view, partly in section, showing an electronic package according to one embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" as used herein is meant to include substrates having at least one (and preferably more) dielectric layer(s) and at least one (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imagable materials, alumina ceramics, glass ceramics, low temperature cofired ceramics, and other like materials wherein the conductive layers are each a metal layer (e.g., power, signal and/or ground) comprised of suitable metallurgical materials such as copper, but may include or comprise additional metals (e.g., nickel, silver, gold, molybdenum, aluminum, etc.) or alloys thereof. If the dielectric materials for the structure are of a photo-imagable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imagable material provides a toughened base of dielectric on which the desired electrical circuitry is formed. An example of a particularly useful photo-imagable dielectric is ASMDF (Advanced Soldermask Dry Film). This composition may include a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; and 3.85% Aerosil 380, an amorphous silicon dioxide from Degussa to provide the solid content. A solvent is present from about 11 to about 13.5% of the total photo-imagable dielectric composition. The dielectric layers taught herein may be typically about 2 mils to about 4 mils thick, but also thicker or thinner if requirements dictate.

By the term "electronic component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system in which the substrate is positioned. The term "electronic component" as used herein is also meant to include both a circuitized substrate (e.g., a chip carrier) and a semiconductor chip positioned thereon, one example of such an assembled component being a chip carrier assembly sold by the Assignee of this invention under the product name "HyperBGA." HyperBGA is a registered trademark of the Assignee, Endicott Interconnect Technologies, Inc.

By the term "electronic package" is meant an electrical assembly including at least one circuitized substrate, at least one electronic component, and at least one heatsink for dissipating heat from the electronic component during component operation.

By the term "heatsink" as used herein is meant a metallic (e.g., including aluminum or copper) heat (thermal) conducting member usable in electronic packaging and capable of having heat from a heat source (e.g., an electronic component such as a semiconductor chip) pass efficiently there-through so as to allow the heat to escape (dissipate) from the heat sink to the environment surrounding same. Various types of heatsinks are commercially available on the market (e.g., from ThermoFlo, Inc. of Newbury Park, Calif., Enertron, Inc. of Chandler, Ariz. and Tucker Engineering, of Peabody, Mass.) and further description is not deemed necessary. One example capable of being used in this invention is referred to in the industry as one having a plurality of fins on one side (e.g., "all fins single side") and is made of aluminum.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

Figure 5:
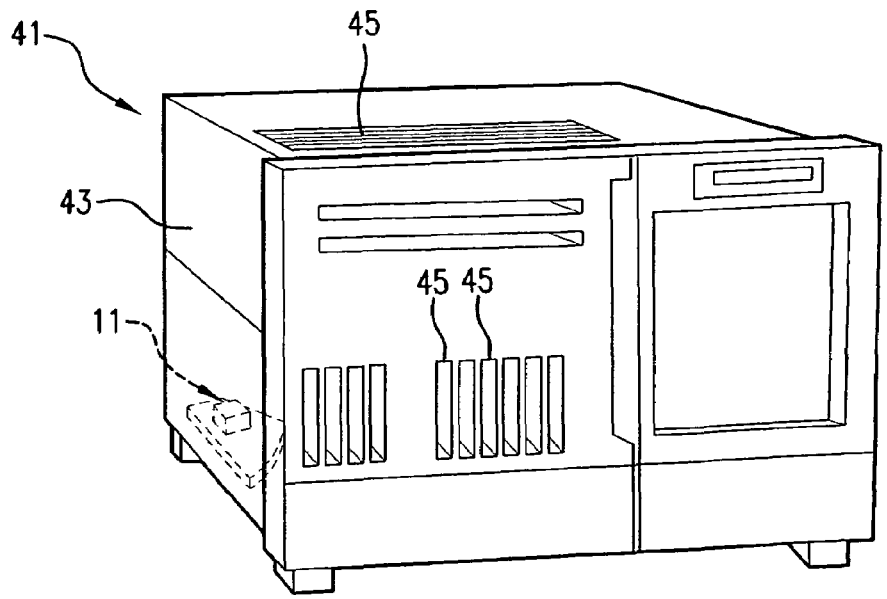
FIG. 5 is a perspective view of an information handling system adapted for having one or more of the electronic packages defined herein as part thereof.

In FIG. 1, there is shown an electronic package 11 according to one embodiment of the invention. Package 11 includes a circuitized substrate 13 (e.g., a chip carrier substrate or a printed circuit board), an electronic component 15 (e.g., a semiconductor chip) positioned on substrate 13 and electrically coupled to the substrate's circuitry (e.g., circuit pads (not shown) on the substrate's upper surface. In one embodiment, package 11 is what might also be referred to in the packaging art as a "module" and the substrate a chip carrier substrate with the illustrated at least one semiconductor chip coupled thereto. One means of such coupling is a plurality of solder balls 17. Substrate 13 is designed for being positioned on and electrically coupled to a second circuitized substrate 21 (shown in phantom), which, in one embodiment, is a printed circuit board (PCB). Such coupling may in turn be provided by a second array of solder balls 18. Both substrates may include internal circuitry and/or other conductive planes, referenced by the numerals 23 and 25 for substrates 13 and 21, respectively. Understandably, the circuitry in substrate 13 serves to interconnect component 15 to the underlying second substrate 21, and this may be accomplished by conventional means such as plated through holes (PTHS). Substrate 21, if a printed circuit board, may in turn be coupled to other elements (not shown) of a larger system such as the circuitry of a personal computer, computer server, or computer mainframe, as seen in FIG. 5. In one particular embodiment, substrate 21 may be coupled to a larger printed circuit board (sometimes referred to as a "motherboard") of such a system.

Package 11 is further shown in FIG. 1 to include a heatsink 29 which is thermally coupled to component 15 in order to provide dissipation of heat generated by the component during operation thereof. Components such as semiconductor chips are known to generate significant heat during operation and must be provided with efficient heat escape or failure may occur. Because such chips often represent the most expensive part of the overall package, and because replacement thereof is not readily possible, failure often means replacement of the entire package and thus a significant financial loss. In one embodiment, heatsink 29 is comprised of aluminum and is secured to an upper surface of substrate 13, preferably using an adhesive 31. Heatsink may instead be secured to the underlying substrate 21, also using suitable adhesive. It is also known in the art to use some form of mechanical means (e.g., a clip or spring clamp) to secure the heatsink in position. Once securely positioned, heatsink 29 exerts a downward force ("F") onto component 15. In one example, this force may exert a pressure within the range from about five pounds per square inch (PSI) to about thirty PSI, and in one particular embodiment, was fifteen PSI.

According to the teachings of this invention, package 11 further includes a thermal interposer 33 (see also FIG. 2) positioned between component 15 and heatsink 29 for providing a thermal path from the component to the heatsink. The thermal interposer of the invention is able to provide such a path in such a manner that efficient heat transference is attained, thus promoting extended component life. Interposer 33 includes at least one compressible resilient member 35 and a plurality of thin, metallic sheet members 37. The interposer, by utilizing a compressible resilient member, is thus able to compensate for excessive force application by heatsink 29 and, in combination with the metallic sheet members, able to accommodate for tolerance ranges of various elements which make up the package as well as those of other packages if the package 11 is utilized with same (see FIG. 3). Member 35 also serves to exert force against the adjacent metallic sheet members 37 to assure conformance thereof and also optimize the thermal path's conductivity. The preferred thin, metallic sheet members are each a copper foil and, in one embodiment, each have a thickness of from about 0.5 mils to about 2.1 mils (a mil being a thousandth of an inch) and a surface roughness (both sides) of from about five microns to about ten microns. In the embodiment shown in FIG. 1, a total of from about two to about twenty such sheet members may be used, although this is not meant to limit the invention and many more than twenty are possible depending on package configuration and elements. As also seen, the outermost of these sheet members is in direct contact with the package's component 15 while the compressible resilient member directly contacts heatsink 33. This orientation is not deemed essential, however, as the elements may be reversed (e.g., the outermost metallic sheet member directly contacting the heatsink, etc.). In one embodiment, resilient member 35 is a thermally conductive silicone rubber elastomeric pad, and possesses an initial thickness of from about five mils to about 100 mils. Other materials suitable for member 35 include silicone-free thermally conductive elastomers (e.g., urethane) and foamed compliant thermally conductive materials (e.g., polyurethanes, fluoroelastomers). Other metals suitable for the sheet members include aluminum, gold, silver, copper (including alloys) and steel.

Figure 2:
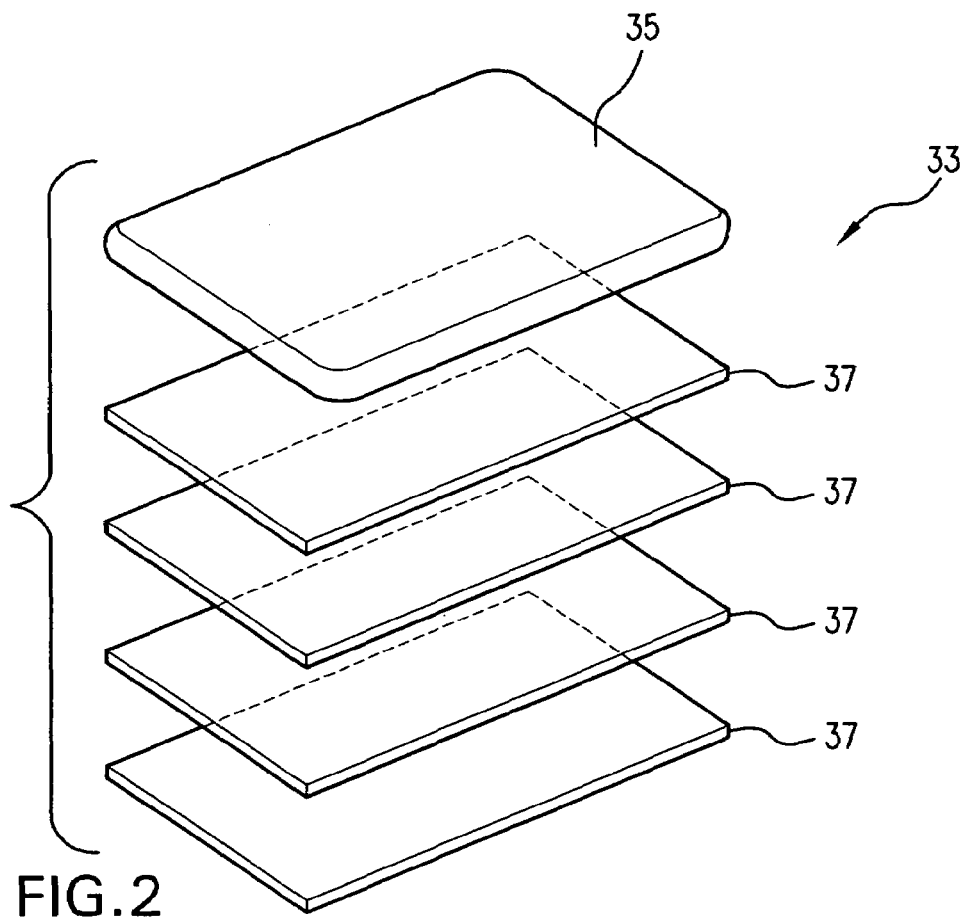
FIG. 2 is an exploded view, on an enlarged view over the view of FIG. 1, showing a thermal interposer according to one embodiment of the invention.

In FIG. 2, interposer 33 is seen in exploded view. Only four metallic sheet members 37 are illustrated, for reference purposes. It is understood that one of the main features of the invention is the ability to remove or add selected numbers of metallic sheets to alter the overall thickness of the interposer. This further enhances the ability to compensate for tolerances of elements as mentioned above. In the embodiment shown in FIG. 2, each sheet member 37 is substantially rectangular in shape (as is the chip component 15) and of width and length dimensions similar to those of the chip to assure maximum physical contact therewith. Member 35 is also of rectangular shape and may possess similar width and length dimensions as the sheet members 37. In one example, such width and length dimensions may be 2000 mils to 2500 mils, respectively.

Figure 3:
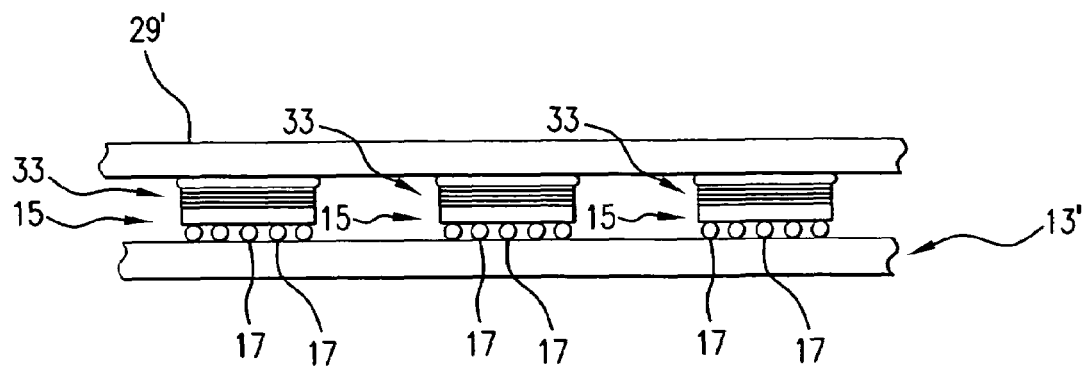
FIG. 3 is a side elevational view, on a smaller scale than the view of FIG. 1, showing a plurality of electronic packages positioned on a common circuitized substrate and thermally coupled to a common heat sink.

In FIG. 3, there is shown a plurality of electronic components 15 positioned on and electrically coupled to a common circuitized substrate 13' (e.g., a PCB). Components 15 may be individual chip carrier packages (chip carrier substrate with one or more chips thereon) or, as shown, each a single semiconductor chip which is coupled to the common PCB using a plurality of solder balls 17. Components 15 in turn are thermally coupled to a common heatsink 29' which, as in the embodiment of FIG. 1, may be secured to PCB 13'. A thermal interposer 33 is used atop each component 15 to provide the needed thermal path to heatsink 29'. It is clearly seen in FIG. 3 that utilization of a specific number of metallic sheet members for each interposer, including where different numbers for each are possible, allows the structure in FIG. 3 to accommodate for tolerances of the various elements, e.g., solder ball diameters, chip thicknesses, PCB non-planarity and heatsink thickness variations across the width of the heatsink, within the full structure. Thus, maximum force on each component 15 is assured, thereby assuring optimum heat transference and escape. Although three components 15 are shown, these advantageous features are attainable with as few as two such components on a common PCB. Each thermal interposer also understandably includes the defined compressible, resilient member (in addition to a specific number of metallic sheet members). In a three component assembly as shown in FIG. 3, the variance in numbers of metallic sheet members between the components may vary from about two to twenty members, given conventional tolerances of known components. This of course is not meant to limit the invention as many more or less may be utilized, as circumstances dictate.

Figure 4:
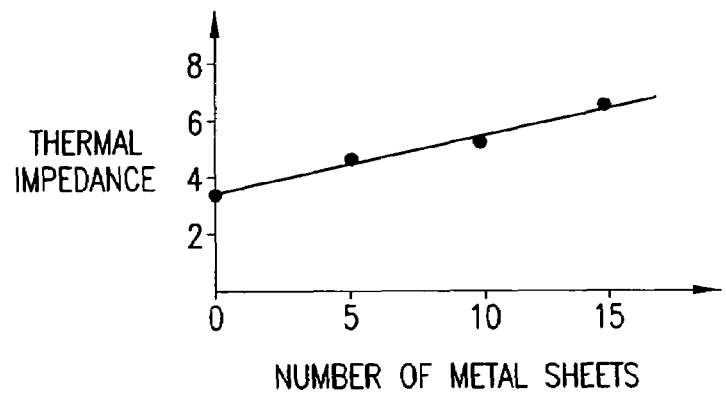
FIG. 4 is a chart showing the increase in thermal impedance for an electronic package such as shown in FIG. 1 relative to the number of thin, metallic members used for the package's thermal interposer.

FIG. 4 is a chart showing the values for thermal impedance (units: in$^2$ C/W) relative to the number of metallic sheet members for an electronic package such as package 11 in FIG. 1. As seen therein, impedance increases with the number of such members. The substantially linear increase makes it relatively easy to determine heat impedance when designing multiple package assemblies, another highly desirable feature of the instant invention. To even further enhance the flow of heat across the interposers taught herein, it is possible to wet the surface(s) of each foil, or one or both of the outer surfaces of the two opposing end foils, with a suitable oil or water soluble polyol. This of course can also be done for a single interposer. Still further enhanced thermal conduction is possible by the introduction of metallic (e.g., silver, aluminum, copper) or other high thermal conductive (e.g., aluminum nitride, boron nitride, diamond) particles between the foils to provide for more direct foil-to-foil contact.

In FIG. 5, there is shown an information handling system 41 which is preferably a personal computer, a mainframe computer or a computer server. Other types of information handling systems known in the art of this type may also utilize the teachings of this invention. As is known, many such systems (e.g., personal computers) include a housing 43, associated venting 45, instrumentation, and many other known components. Significantly, system 41 may include one or more of the electronic packages as taught herein, including the one depicted in FIG. 1 and the larger assembly of same depicted in FIG. 3. By way of a more specific example, the printed circuit board 21 in FIG. 1 could be coupled to the system's "motherboard" and/or other components of the system. Package 11 is shown in phantom in FIG. 5 to emphasize this relationship. PCB 21 is also shown for this purpose.

While there have been shown and described what are at present the preferred embodiments of the invention, it will be obvious to those skilled in the art that various changes and modifications may be made therein without departing from the scope of the invention as defined by the appended claims.

What is claimed is:

1. An electronic package comprising:
   a first circuitized substrate;
   a first electronic component positioned on said first circuitized substrate;
   a heatsink thermally coupled to said first electronic component for providing escape of heat therefrom during operation thereof; and
   an adjustable thermal interposer positioned between said first electronic component and said heatsink and thermally coupled thereto for providing a thermal path for heat generated by said first electronic component to said heatsink, said thermal interposer including at least one compressible resilient member and a plurality of separable, thin, and removable metallic foil sheets placed without attachment between said heatsink and said first electronic component.

2. The electronic package of claim 1 wherein said first circuitized substrate comprises a chip carrier substrate and said first electronic component comprises a semiconductor chip.

3. The electronic package of claim 1 wherein said compressible resilient member of said at least one adjustable thermal interposer comprises an elastomeric pad.

4. The electronic package of claim 3 wherein said elastomeric pad comprises silicone rubber.

5. The electronic package of claim 1 wherein each of said plurality of separable thin, and removable metallic foil sheets of said adjustable thermal interposer comprises a copper foil.

6. The electronic package of claim 5 wherein the number of foil sheets is within the range of from about two to about twenty.

7. The electronic package of claim 1 wherein said at least one compressible resilient member is in physical contact with said heatsink and at least one of said thin, and removable metallic foil sheets is in physical contact with said first electronic component, said at least one compressible resilient member being in physical contact with another one of said separable thin, and removable metallic foil sheets.

8. The electronic package of claim 7 wherein said compressible resilient member of said at least one adjustable thermal interposer comprises an elastomeric pad and each of said plurality of separable thin, and removable metallic foil sheets of said adjustable thermal interposer comprises a copper foil.

9. The electronic package of claim 7 wherein selected ones of said plurality of separable thin, and removable metallic foil sheets is removable from said adjustable thermal interposer to vary the thickness thereof.

10. The electronic package of claim 9 further including a second circuitized substrate positioned adjacent said first circuitized substrate, a second electronic component positioned on said second circuitized substrate, and a second adjustable thermal interposer positioned between said second electronic component and said heatsink for providing a thermal path for heat generated by said second electronic component to said heatsink, said second adjustable thermal interposer including at least one compressible resilient member and a plurality of separable thin, and removable metallic foil sheets, said heatsink also being thermally coupled to said second electronic component for also providing escape of heat from said second electronic component during operation thereof.

11. The electronic package of claim 10 further including a third circuitized substrate, said third circuitized substrate having a third electronic component positioned thereon and said second circuitized substrate being positioned on said third circuitized substrate.

12. The electronic package of claim 11 wherein said third circuitized substrate comprises a printed circuit board, said third circuitized substrate and said second circuitized substrate each comprising a chip cater substrate and said second and third electronic components each comprising a semiconductor chip.

13. The electronic package of claim 1 further including a second circuitized substrate, said second circuitized substrate comprising a printed circuit board, said first circuitized substrate also comprising a chip cater substrate positioned on said second circuitized substrate and said first electronic component comprising a semiconductor chip.

14. The electronic package of claim 13 further including a housing, said printed circuit board, said first circuitized substrate, said first electronic component, said heatsink and said adjustable thermal interposer being positioned within said housing, said electronic package comprising an information handling system.

15. The electronic package of claim 14 wherein said information handling system is selected from the group of information handling systems consisting of a personal computer, computer server and computer mainframe.

16. The electronic package of claim 1 further including a second circuitized substrate, said first circuitized substrate being positioned on said second circuitized substrate, said heatsink being secured to said second circuitized substrate in such a manner so as to exert a force onto said adjustable thermal interposer.

17. An adjustable thermal interposer for use with an electronic package, said adjustable thermal interposer comprising:
   at least one compressible resilient member; and
   a plurality of separable, thin, and removable metallic foil sheets, at least one of said separable, thin, and removable metallic foil sheets being positioned in direct contact with said at least one compressible resilient member, each of said plurality of separable, thin, and removable metallic foil sheets being placed without attachment to a heatsink or an electronic component.

18. The adjustable thermal interposer of claim 17 wherein said compressible resilient member comprises an elastomeric pad.

19. The adjustable thermal interposer of claim 18 wherein said elastomeric pad comprises silicone rubber.

* * * * *